United States Patent
Swain et al.

(10) Patent No.: US 7,541,256 B2
(45) Date of Patent: Jun. 2, 2009

(54) METHOD OF FABRICATING BACK-ILLUMINATED IMAGING SENSORS USING A BUMP BONDING TECHNIQUE

(75) Inventors: Pradyumna Kumar Swain, Princeton, NJ (US); Peter Levine, West Windsor, NJ (US); Mahalingam Bhaskaran, Lawrenceville, NJ (US); Norman Goldsmith, East Brunswick, NJ (US)

(73) Assignee: Sarnoff Corporation, Princeton, NJ (US)

( * ) Notice: Subject to any disclaimer, the term of this patent is extended or adjusted under 35 U.S.C. 154(b) by 6 days.

(21) Appl. No.: 11/779,414

(22) Filed: Jul. 18, 2007

(65) Prior Publication Data

US 2008/0237762 A1    Oct. 2, 2008

Related U.S. Application Data

(60) Provisional application No. 60/908,436, filed on Mar. 28, 2007.

(51) Int. Cl.
H01L 21/76  (2006.01)
(52) U.S. Cl. .................. 438/401; 438/455; 257/797; 257/E23.179
(58) Field of Classification Search ............ 438/401, 438/424, 455; 257/797, E23.797
See application file for complete search history.

(56) References Cited

U.S. PATENT DOCUMENTS

| | | | |
|---|---|---|---|
| 5,185,292 A | 2/1993 | VanVonno et al. | |
| 7,238,583 B2 | 7/2007 | Swain et al. | |
| 2004/0082108 A1 | 4/2004 | Thomas et al. | |
| 2007/0058059 A1* | 3/2007 | Suehiro | 348/294 |

FOREIGN PATENT DOCUMENTS

WO    WO 20070032632 A1 *    3/2007

* cited by examiner

Primary Examiner—Michelle Estrada
Assistant Examiner—Jarret J Stark
(74) Attorney, Agent, or Firm—Lowenstein Sandler PC (57) ABSTRACT

A method for fabricating a back-illuminated semiconductor imaging device on a semiconductor-on-insulator substrate, and resulting imaging device is disclosed. The method for manufacturing the imaging device includes the steps of providing a substrate comprising an insulator layer, and an epitaxial layer substantially overlying the insulator layer; fabricating at least one imaging component at least partially overlying and extending into the epitaxial layer; forming a plurality of bond pads substantially overlying the epitaxial layer; fabricating a dielectric layer substantially overlying the epitaxial layer and the at least one imaging component; providing a handle wafer; forming a plurality of conductive trenches in the handle wafer; forming a plurality of conductive bumps on a first surface of the handle wafer substantially underlying the conductive trenches; and bonding the plurality of conductive bumps to the plurality of bond pads.

19 Claims, 8 Drawing Sheets

FIG. 17B

METHOD OF FABRICATING BACK-ILLUMINATED IMAGING SENSORS USING A BUMP BONDING TECHNIQUE

CROSS-REFERENCE TO RELATED APPLICATIONS

This application claims the benefit of U.S. provisional patent application No. 60/908,436 filed Mar. 28, 2007, the disclosure of which is incorporated herein by reference in its entirety.

FIELD OF THE INVENTION

The field of the present invention is semiconductor device fabrication and device structure. More specifically, the present invention relates to a back illuminated image array device and a method of constructing such a device.

BACKGROUND OF THE INVENTION

CMOS or CCD image sensors are of interest in a wide variety of sensing and imaging applications in a wide range of fields including consumer, commercial, industrial, and space electronics. Imagers based on charge coupled devices (CCDs) are currently the most widely utilized. CCDs are employed either in front or back illuminated configurations. Front illuminated CCD imagers are cost effective to manufacture compared to back illuminated CCD imagers such that front illuminated devices dominate the consumer imaging market. Front side illumination, while traditionally utilized in standard imagers, has significant performance limitations such as low fill factor/low sensitivity. The problem of low fill factor/low sensitivity is typically due to shadowing caused by the presence of opaque metal bus lines, and absorption by the array circuitry structure formed on the front surface in the pixel region. Thus, the active region of the pixel is typically very small (low fill factor) in large format (high-resolution) front illuminated imagers.

Thinned, back illuminated, semiconductor imaging devices are advantageous over front-illuminated imagers for high fill factor, better overall efficiency of charge carrier generation and collection, and are suitable for small pixel arrays. One goal of the performance of back illuminated, semiconductor imaging devices is that the charge carriers generated by light or other emanation incident on the backside should be driven to the front side quickly to avoid any horizontal drift, which may smear the image. It is also desirable to minimize the recombination of the generated carriers before they reach the front side, since such recombination reduces overall efficiency and sensitivity of the device.

These desires may be achieved by providing a thin semiconductor layer and a high electric field within this layer. The field should extend to the back surface, so that the generated carriers, such as electrons or holes, can be driven quickly to the front side. This requires additional treatment at the backside of the device, which adds to the complexity of the fabrication process. One current technique includes chemical thinning of semiconductor wafers and deposition of a "flash gate" at the backside after thinning. This requires critical thickness control of the backside flash gate. Another technique involves growth of a thin dopant layer on a wafer back using molecular beam epitaxy (MBE). Still another known method used to provide a desired electric field is to create a gradient of doping inside the thinned semiconductor layer by backside implant of the layer followed by appropriate heat treatment for annealing and activation. These methods can not be easily included in conventional semiconductor foundry processing, and require more expensive custom processing.

Fabrication of thinned back-illuminated imagers has other challenges: For example, thinned back illuminated imagers can have inherent dangling bonds present at the silicon back surface, which may cause generated electrons to recombine at the back surface. Therefore, quantum efficiency (QE) can be degraded if the backside of the thinned imager is not treated to reduce traps. Thinning of wafers poses yield issues such as stress in the thinned wafer due to non-uniformity of epitaxial layer thickness. For these and the above reasons, fabrication cost is much higher for high volume production of back-illuminated imagers than for front illuminated imagers.

A cost effective process for manufacturing silicon-on-insulator (SOI) based back illuminated CCD/CMOS imagers is proposed in co-pending, commonly owned U.S. patent application Ser. No. 11/350,546, the disclosure of which is incorporated herein by reference in its entirety. The fabrication method proposed in that application not only solves the above mentioned problems, but also had several advantages over other proposals for back illuminated CCD/CMOS imagers, including:

- The proposed method is fully compatible with existing CCD/CMOS imager foundry processes.
- The proposed method has no need for any special backside treatment.
- The buried oxide layer of the SOI wafers acts as a natural stopping layer for a high throughput thinning process.
- The thickness of epitaxial layer grown using this process is precisely controlled. This, in conjunction with the natural stopping oxide insulating layer of the SOI, can result in highly uniform thickness as compared to conventional approaches.
- The proposed method allows for multi-level metal processing.
- Devices manufactured using the proposed method can be fully tested before applying the steps of wafer thinning/lamination, which results in major cost reductions in a production environment.

Some imaging systems incorporate color filters and micro-lenses into the image sensors to produce wavelength dependent signals. To date, this has been done mostly with front illuminated imagers. Fabrication of color filters and micro-lens for thinned back illuminated imagers, even for the method proposed above, is a complex process. Alignment of color filters/micro-lenses on the backside to the pixels in the front side is very critical. Back to front alignment is possible, but with less degree of alignment accuracy. Apart from that, wire bonding and packaging of such back thinned imagers with color filters and micro-lenses add to complexity of the process.

Accordingly, what would be desirable, but has not yet been provided, is a device and method for fabricating back illuminated imagers which can cost-effectively incorporate color filters, micro-lenses, and wire bonding techniques.

SUMMARY OF THE INVENTION

Disclosed is a method and resulting device for back-illuminated imaging device employing semiconductor-on-insulator (SOI) substrates. The method for manufacturing the imaging device includes the steps of providing a substrate comprising an insulator layer, and an epitaxial layer substantially overlying the insulator layer; fabricating at least one imaging component at least partially overlying and extending into the epitaxial layer; forming a plurality of bond pads substantially overlying the epitaxial layer; fabricating a dielectric layer substantially overlying the epitaxial layer and the at least one imaging component; providing a handle wafer; forming a plurality of conductive trenches in the handle wafer; forming a plurality of conductive bumps on a first surface of the handle wafer substantially underlying the conductive trenches; and bonding the plurality of conductive bumps to the plurality of bond pads.

The resulting back-illuminated semiconductor imaging device, comprises an insulator layer; an epitaxial layer substantially overlying the insulator layer; at least one imaging component formed at least partially overlying and extending into the epitaxial layer; a dielectric layer formed substantially overlying the at least one imaging component and epitaxial layer; a plurality of bond pads substantially overlying the dielectric layer; and a handle wafer having conductive trenches formed therein, the conductive trenches being bonded to the plurality of bond pads.

In some embodiments, at least one imaging component has an imaging area, and wherein at least one of the plurality of bond pads substantially overlying the epitaxial layer also at least partially overlies the imaging area. The plurality of conductive trenches are formed in the handle wafer by etching vias in the handle wafer; filling the vias with a conducting material; and smoothing a surface of the handle wafer. The vias are filled with a conductive material using an electroplating or sputtering technique. The conductive material can be a metal such as gold, tin, or wolfram.

A plurality of alignment keys are formed at least partially overlying and extending into the epitaxial layer. The alignment keys in the epitaxial layer are formed by printing key patterns on a top portion of the epitaxial layer; etching the underlying epitaxial layer below the key patterns using a trench etch process until the etched away silicon is stopped by the underlying insulator/buried oxide layer; and filling the opened trenches with one of an oxide of silicon, silicon carbide, silicon nitride, and poly-silicon.

The imaging components can include CMOS imaging components, charge-coupled device (CCD) components, photodiodes, avalanche photodiodes, or phototransistors, in any combination. The optical components can include color filters and micro-lenses, in any combination.

DETAILED DESCRIPTION OF THE INVENTION

The following embodiments are intended as exemplary, and not limiting. In keeping with common practice, figures are not necessarily drawn to scale.

Figure 1:
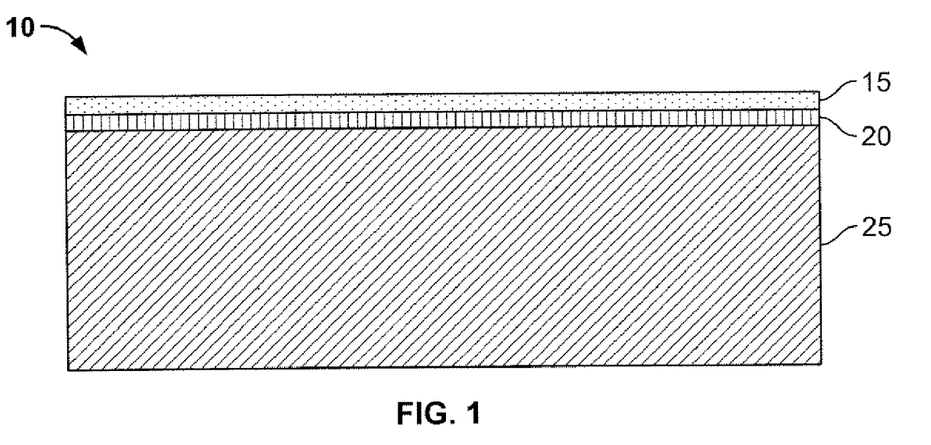
FIG. 1 shows a silicon-on-insulator (SOI) substrate employed in a process for fabricating a back-illuminated imaging device, according to an embodiment of the present invention.

FIG. 1-15 illustrate an embodiment of a process for manufacturing thinned back-illuminated imagers and a resulting structure. FIG. 1 illustrates initial substrate 10 sometimes referred to in the art as a semiconductor-on-insulator (SOI) substrate. Starting SOI substrate 10, shown in FIG. 1, is composed of handle wafer 25 to provide mechanical support during processing, an insulator layer 20 (which can be, for example, a buried oxide layer of silicon), and seed layer 15. In the present embodiment, the handle wafer 25 may be a standard silicon wafer used in fabricating integrated circuits. Alternatively, the handle wafer 25 may be any sufficiently rigid substrate composed of a material which is compatible with the steps of the method disclosed herein. Insulator layer 20 may comprise an oxide of silicon with a thickness of about 1 micrometer. Among other embodiments, the thickness of insulator layer 20 may fall in a range from about 10 nm to about 5000 nm. Seed layer 15 may be comprised of crystalline silicon having a thickness from about 5 nanometers to about 100 nanometers.

SOI substrates are available commercially and are manufactured by various known methods. In one method, thermal silicon oxide is grown on silicon wafers. Two such wafers are joined with oxidized faces in contact and raised to a high temperature. In some variations, an electric potential difference is applied across the two wafers and the oxides. The effect of these treatments is to cause the oxide layers on the two wafers to flow into each other, forming a monolithic bond between the wafers. Once the bonding is complete, the silicon on one side is lapped and polished to the desired thickness of seed layer 15, while the silicon on the opposite side of the oxide forms handle wafer 25. The oxide forms insulator layer 20.

Another method of fabricating a SOI substrates begins with obtaining a more standard semiconductor-on-insulator (SOI) wafer in which the seed layer 15 has a thickness in the range from about 100 nm to about 1000 nm. A thermal oxide is grown on the semiconductor substrate, using known methods. As the oxide layer grows, semiconductor material of the semiconductor substrate is consumed. Then the oxide layer is selectively etched off, leaving a thinned semiconductor substrate having a desired seed layer thickness.

SOI substrates manufactured by an alternative method, known as Smart Cut.™., are sold by Soitec, S.A.

Seed layer 15 may comprise silicon (Si), Germanium (Ge), SiGe alloy, a III-V semiconductor, a II-VI semiconductor, or any other semiconductor material suitable for the fabrication of optoelectronic devices.

Figure 2:
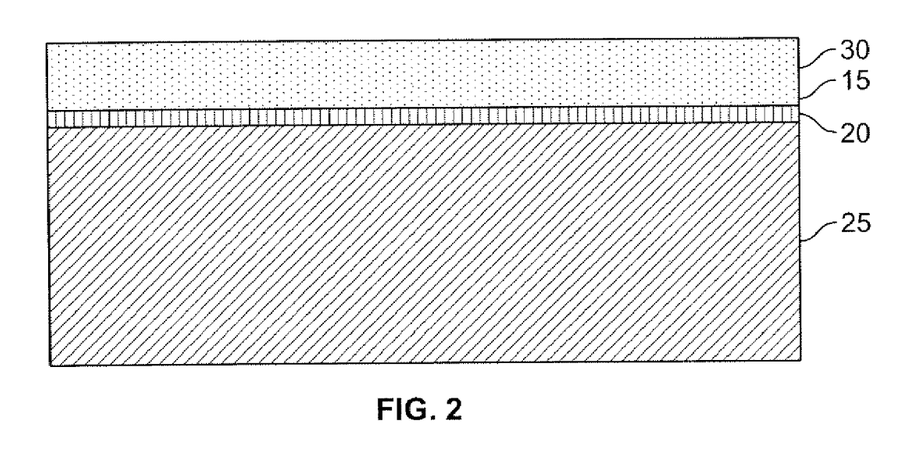
FIG. 2 shows the step of forming an epitaxial layer on the seed layer of the SOI substrate depicted in FIG. 1.

Referring now to FIG. 2, epitaxial layer 30 is formed on the seed layer 15, using seed layer 15 as the template. Depending on the material of seed layer 15, epitaxial layer 30 may comprise silicon (Si), Germanium (Ge), SiGe alloy, a III-V semiconductor, a II-VI semiconductor, or any other semiconductor material suitable for the fabrication of optoelectronic devices. Epitaxial layer 30 may have a thickness from about 1 micrometers to about 50 micrometers. The resistivity of the epitaxial layer 30 can be controlled by controlling the epitaxial growth process.

Figure 3A:
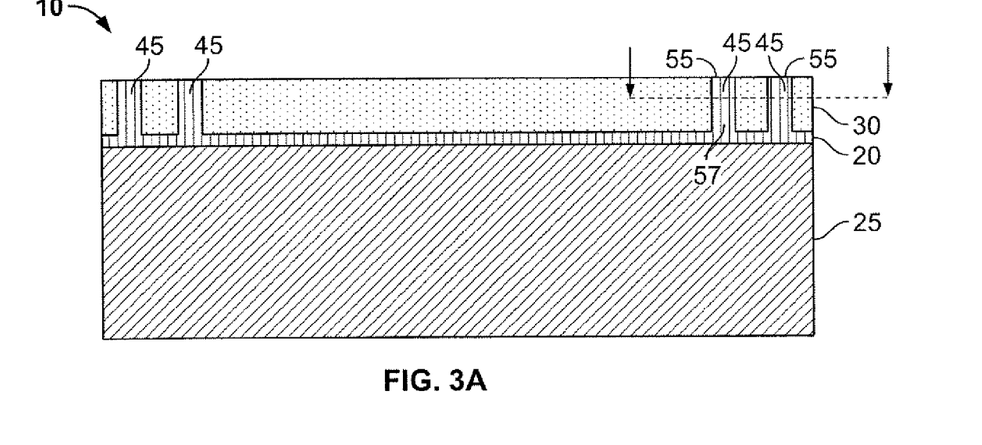
FIG. 3 shows the step of forming alignment keys in the epitaxial layer, according to an embodiment of the present invention.
Figure 3B:
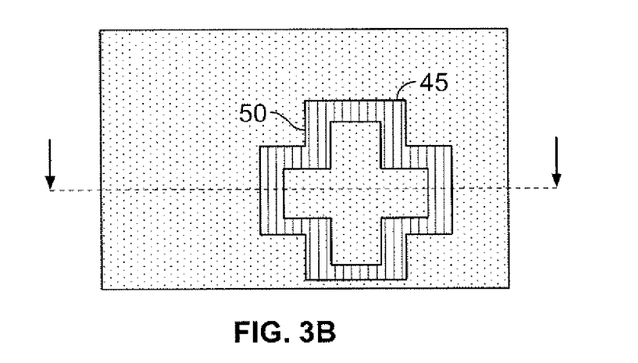

Referring now to FIG. 3, once epitaxial layer 30 is grown, alignment keys 45 are printed on and etched into the epitaxial layer 30. The alignment keys 45 can be used to align subsequent layers during the imager fabrication process and also can be used to align color filters on the backside after the wafers are thinned. The use of alignment keys can result in highly accurate alignment of about 0.1 micrometer or less for subsequently deposited layers. The alignment keys 45 can also be used to open bond pad areas for wire bonding to the backside of the resultant device. Using photolithography, key patterns 50 are printed on a top portion 55 of the epitaxial layer 30. A trench etch process can be used to etch the underlying epitaxial layer 30 below the key patterns 50 until the etched away silicon is stopped by the underlying insulator/buried oxide layer 20 using plasma etching. The open trenches 57 are then filled with a electrically insulating material such as an oxide of silicon, silicon carbide, silicon nitride, or poly-silicon.

Figure 4A:
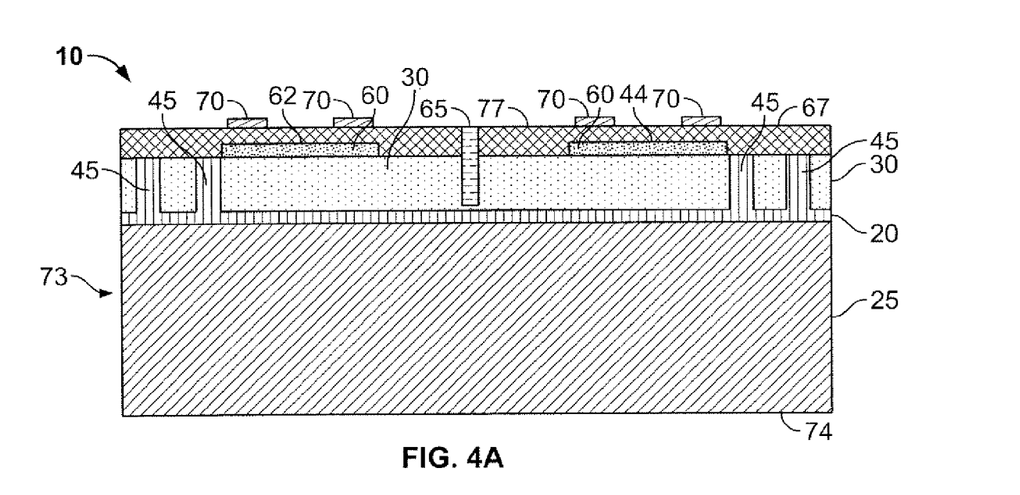
FIG. 4 shows the step of fabricating one or more imaging components on the epitaxial layer, and printing and etching bond pad areas in the epitaxial layer at locations between the alignment keys of FIG. 3.
Figure 4B:
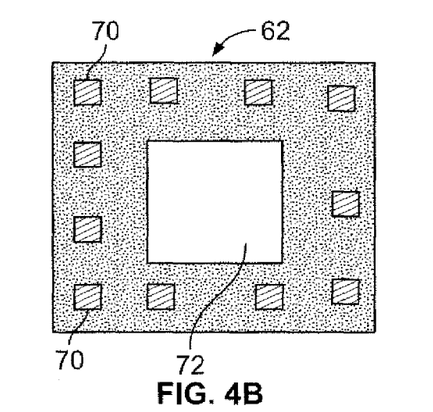

Referring now to FIG. 4, one or more imaging components 60 may be fabricated on the epitaxial layer 30 using known methods of semiconductor fabrication. These imaging components 60 may include charge-coupled device (CCD) components, CMOS imaging components, photodiodes, avalanche photodiodes, phototransistors, or other optoelectronic devices, in any combination. The imaging components 60 may include both CCD and CMOS components fabricated in separate areas of epitaxial layer 30 using known masking methods. Also included may be other electronic components such as CMOS transistors, (not shown) bipolar transistors (not shown), capacitors (not shown), or resistors (not shown). The imaging components 60 may be aligned on the epitaxial layer 30 using the alignment keys 45 as a guide. When several imagers are fabricated on the epitaxial layer 30, one or more dicing streets 65 may be present in the epitaxial layer 30. As a preliminary step in the process of attaching a second handle wafer using bump bonds to be discussed hereinbelow, a dielectric layer 67 made of an oxide or nitride of silicon may be deposited over the imaging components 60 and the alignment keys 45. A plurality of (conductive) metal bond pads 70 are formed on the dielectric layer 67 overlying the imaging components in a pattern which does not obstruct an imaging area 72 of any of the imaging components 60 of what is now a first device structure 73.

Figure 5:
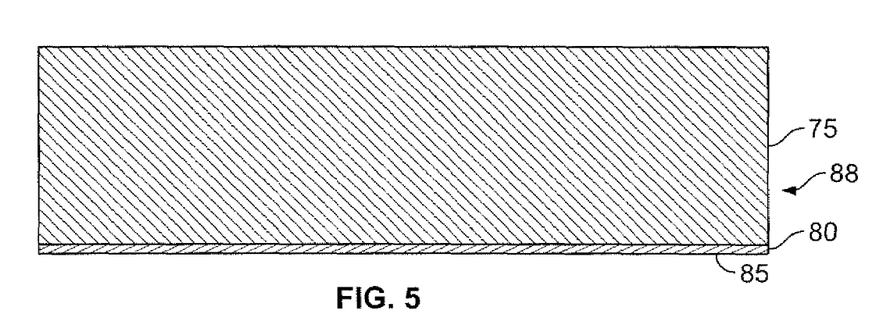
FIG. 5 shows the step of preparing a second handle wafer to be attached to the side of device containing the one or more imaging components of FIG. 4.

Referring now to FIGS. 4 and 5, further processing of components can be made to the back side 74 of the first device structure 73, necessitating the addition of a second handle wafer 75 to the front side 77 of the first device structure 73 for providing further mechanical support. To add the second handle wafer 75 to the front side 77 of the first device structure 73, the second handle wafer 75 can be bump bonded to the bond pads 70 on the front side 77 of the first device structure 73. The second handle wafer 75 can be made of any suitable material that provides mechanical support, such as silicon, aluminum nitride, or ceramic. A seed layer 80 of any suitable metal, such as gold, tin, wolfram, etc., can be deposited on a first side 85 of the second handle wafer 75. The resulting second device structure 88 is now ready for bump bonding to the first device structure 73.

Figure 6:
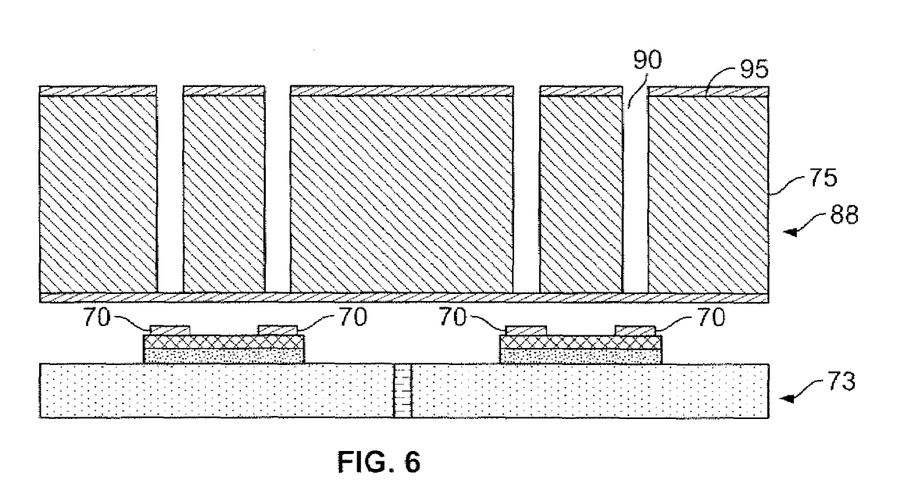
FIG. 6 shows the step of etching vias in the second handle wafers at locations that are to be aligned with the bond pad areas of FIG. 4.
Figure 7:
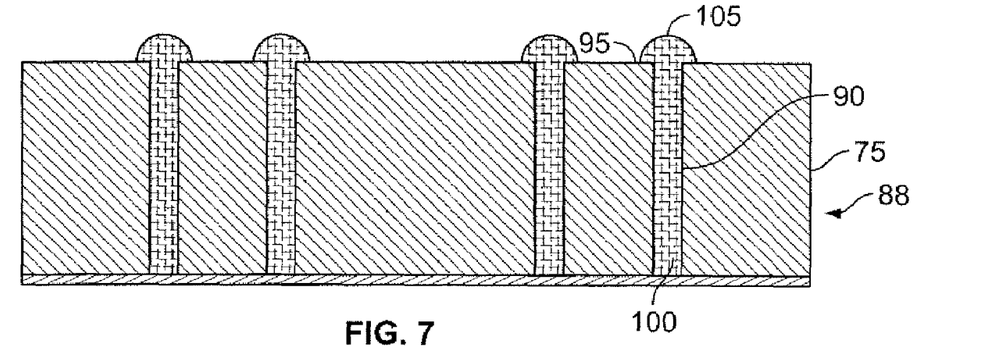
FIG. 7 shows the step of filling the vias of FIG. 6 with a conducting material by means of electroplating or sputtering to form filled metal trenches.
Figure 8:
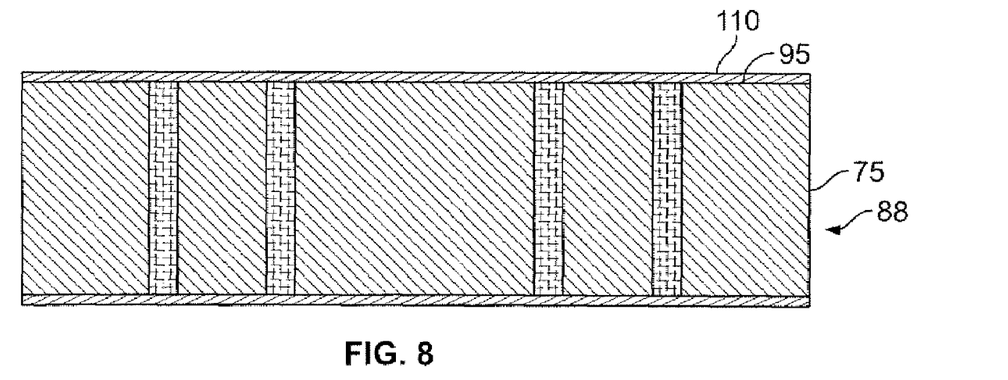
FIG. 8 shows the step of smoothing the surface of and depositing metal on the second side of the second handle wafer.
Figure 9:
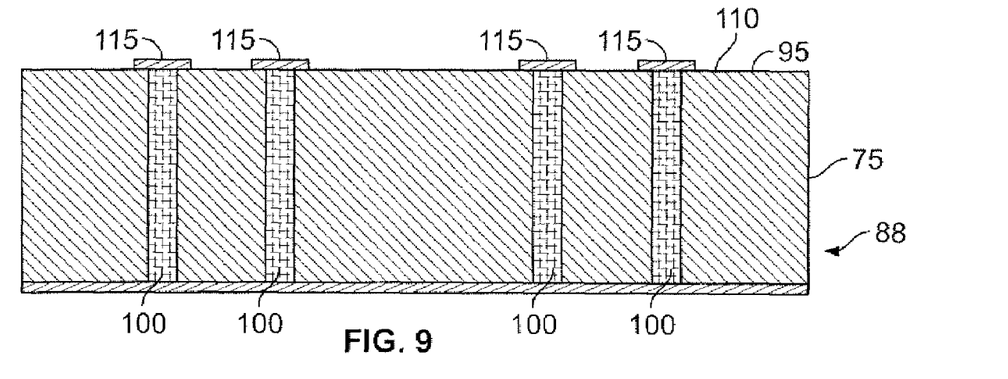
FIG. 9 shows the step of defining a plurality of bond pads over the filled metal trenches on the second surface of the second handle wafer.
Figure 10:
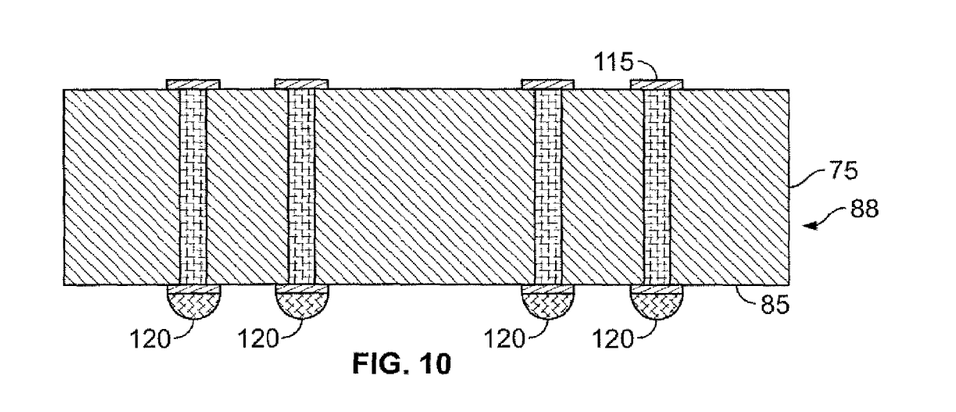
FIG. 10 depicts the step of forming a plurality of metal bumps on the bond pads on the first side of the second handle wafer.

Referring now to FIG. 6, a plurality of vias 90 are defined and etched into a second side 95 of the second handle wafer 75. The vias 90 are aligned with the positions of the bond pads 70 of the first device structure 73. Referring now to FIG. 7, the vias 90 are filled with a suitable conducting material by means of electroplating or sputtering to form filled metal trenches 100. If the second handle wafer 75 is made of silicon, electrical isolation needs to be provided between the second handle wafer 75 and the filled metal trenches 100. As a byproduct of the electroplating or sputtering process, excess metal 105 may protrude from and overhang the metal trenches on the second side 95 of the second handle wafer 75. Referring now to FIG. 8, any overhanging metal is removed and the surface of the second side 95 of the second handle wafer 75 is made smooth and flat using a chemical mechanical polishing process (CMP). A metal layer 110 is deposited over the second side 95 of the second handle wafer 75 and the filled metal trenches 100. Referring now to FIG. 9, a plurality of bond pads 115 are defined over the filled metal trenches 100 using a photolithographic process and by etching away portions of the metal layer 110 from the second surface 95 of the second handle wafer 75. Referring now to FIG. 10, a plurality of metal bumps 120 are formed on the bond pads 115 on the first side 85 of the second handle wafer 75. The metal bumps 120 are made from a suitable metal such as indium. The second device structure 88 is now ready for bump bonding to the first device structure 73.

Figure 11:
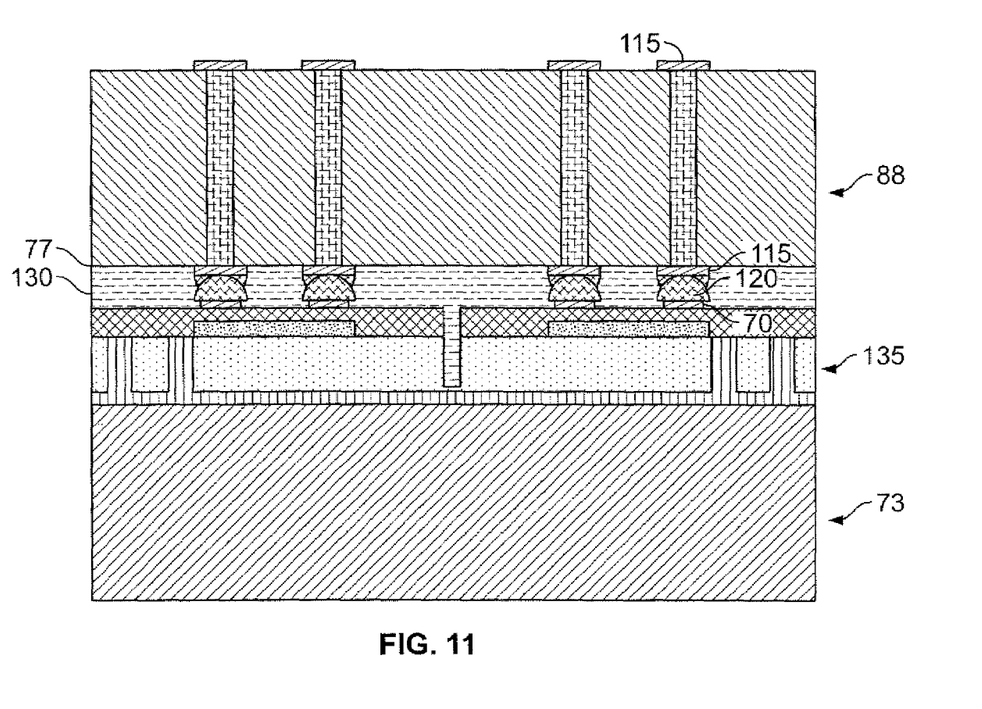
FIG. 11 depicts the step of bump bonding the second handle wafer structure to the SOI device wafer structure to produce a composite imager structure.

Referring now to FIG. 11, bump bonding of the second device structure 88 to the first device structure 73 is depicted. After aligning structures 73, 88 using the bond pads 70, 115 as keys, the metal bumps 120 of the second handle wafer 75 are bonded to the bond pads 70 on the front side 77 of the second device structure 88. Bonding is effected by means of applying an appropriate elevated pressure and an appropriate temperature to the aligned structures 88, 73. Because of the applied pressure and elevated temperature, the metal bumps 120 fuse to the bond pads 70, forming solid metal contacts between the structures 88, 73. To provide mechanical support between the structures 88, 73, the resulting gap 130 between the structures 88, 73 is filled with a suitable epoxy/glue to form a single imager structure 135.

Figure 12:
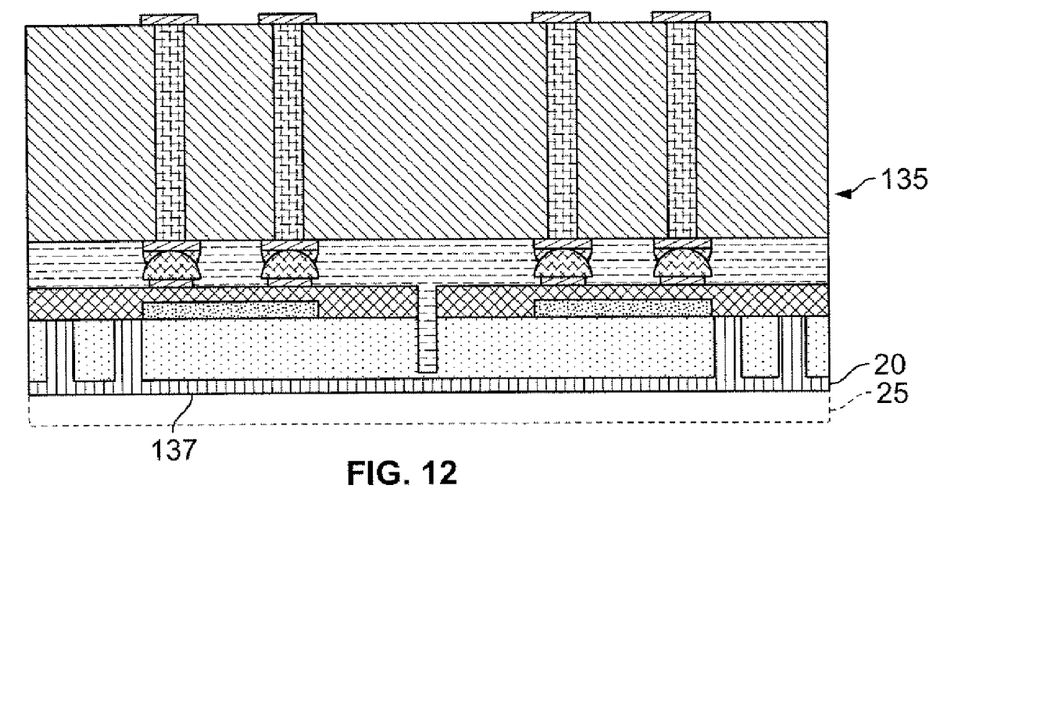
FIG. 12 shows the step of removing of the first handle wafer belonging to the initial SOI wafer structure of FIG. 1.
Figure 13:
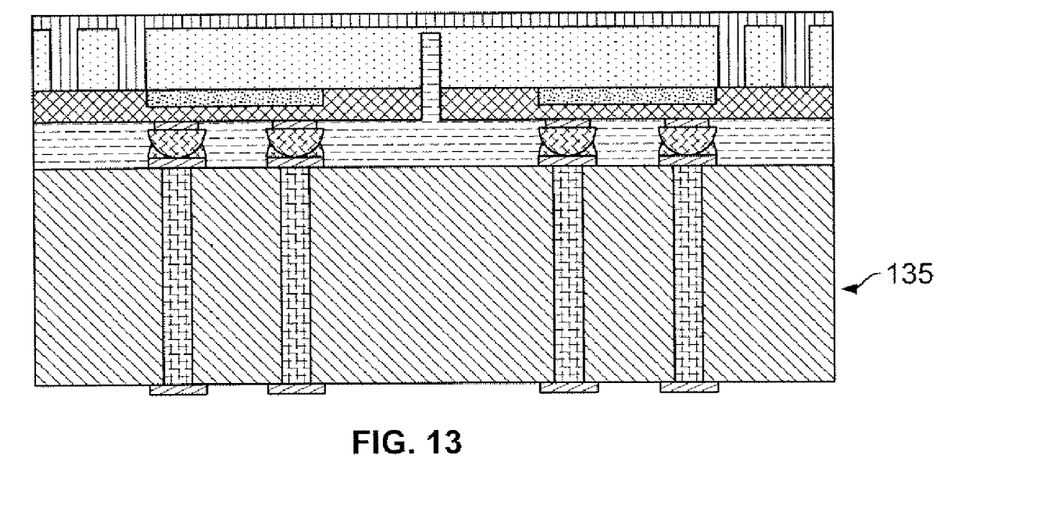
FIG. 13 shows the step of flipping the composite imager structure over for further processing.

Referring to FIGS. 12 and 13, the next step of the process include the removal of the first handle wafer 25. Handle wafer 25 is no longer needed to provide mechanical stability. Removal of handle wafer 25 may be accomplished by partial mechanical grinding followed by chemical etching, mechanical grinding, or a combination of these methods. With chemical etching, handle wafer 25 may be removed selectively, without removing insulator layer 20, to produce a smooth back side 137 of the imager structure 135. The insulating layer 20 acts as an etch stop layer. The imager structure 135 is then flipped over (FIG. 13) for further processing.

Figure 14:
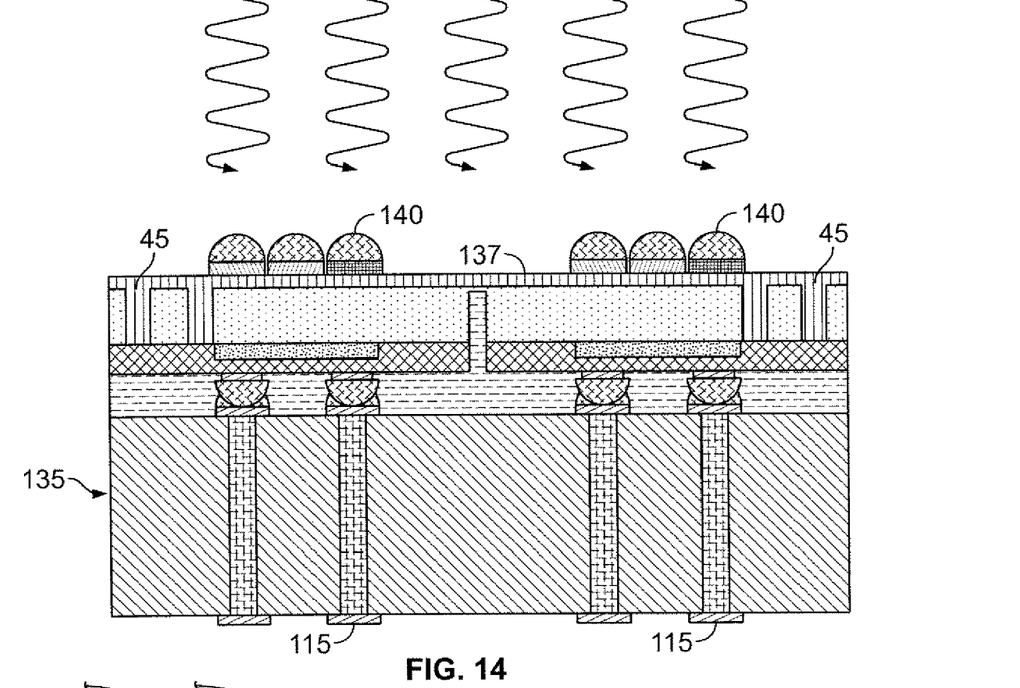
FIG. 14 shows the step of bonding optical components to the back side of the a composite imager structure using the alignment keys as guides.
Figure 15:
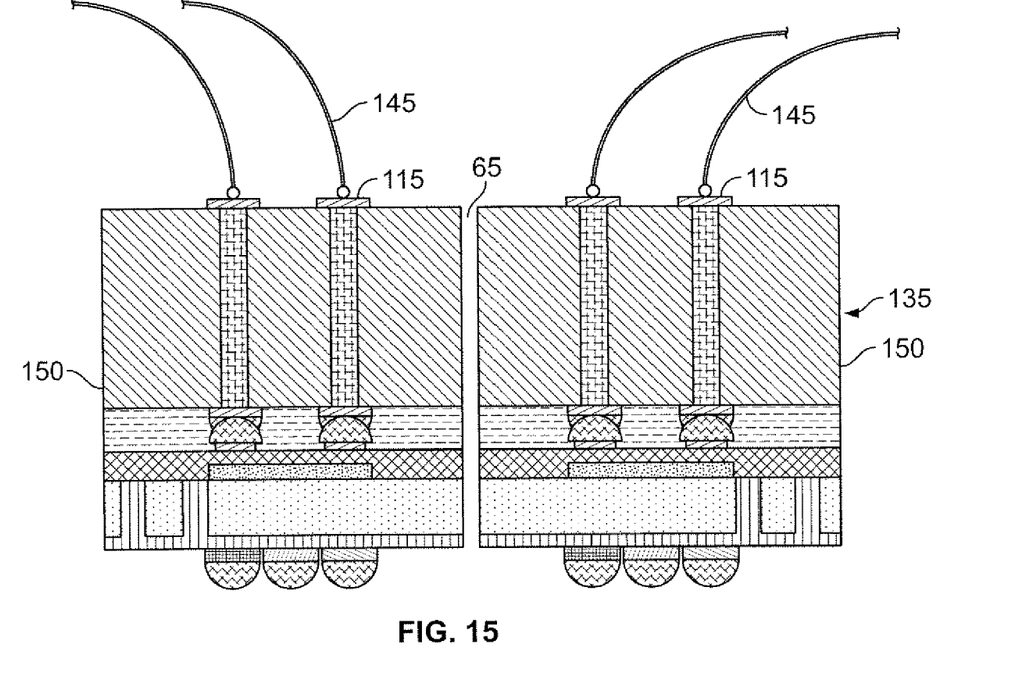
FIG. 15 shows the step of fabricating metallic contacts and attaching bond wires to the metallic contacts on the back side of the composite imager structure.

Referring now to FIG. 14, optical components 140 can be bonded to the back side 137 of the imager structure 135 using the alignment keys 45 as precision guides. The one or more optical components can comprise color filters and micro-lenses to produce wavelength dependent signals. Referring now to FIG. 15, if dicing streets 65 are present for manufacturing a plurality of imagers, at this time, the dicing streets 65 are used as guides for dicing the imaging structure 135 into a plurality of separate imaging structures 150. Then bond wires 145 are bonded to bond pads 115.

Figure 16:
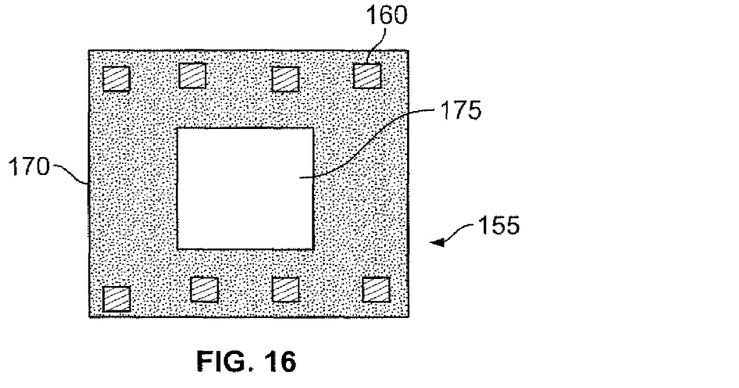
FIG. 16 is a top plan view of a front illuminated imager, wherein bond pads are distributed about its outer periphery so as to provide an unobstructed imaging area.

The bump bonding fabrication technique for back-illuminated imagers of the present invention provides a distinct advantage over front-illuminated imagers manufactured by other techniques. FIG. 16 shows a top plan view of a front illuminated imager 155. Since the front illuminated imager 155 needs to have an unobstructed imaging area 175 to allow incident light to fall on the imaging pixels (not shown) in the imaging area 175, the bond pads 160 are distributed about the outer periphery 165 of the top 170 of the front illuminated imager 155. It is desirable to reduce the size of the front illuminated imager 155, which requires a reduction of the size of the pixels in the imaging area 175. Since the size of the bond pads 160 cannot be reduced, the ratio of the area occupied by the bond pads 160 to the imaging area 175 increases.

Figure 17A:
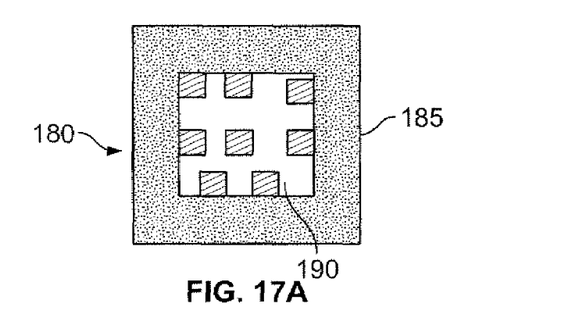
FIG. 17A is a top plan view of a back illuminated imager constructed in accordance with the present invention, wherein bond pads can be placed within the pixel area of the front side of the imager, thereby enabling the reduction of the overall size.
Figure 17B:
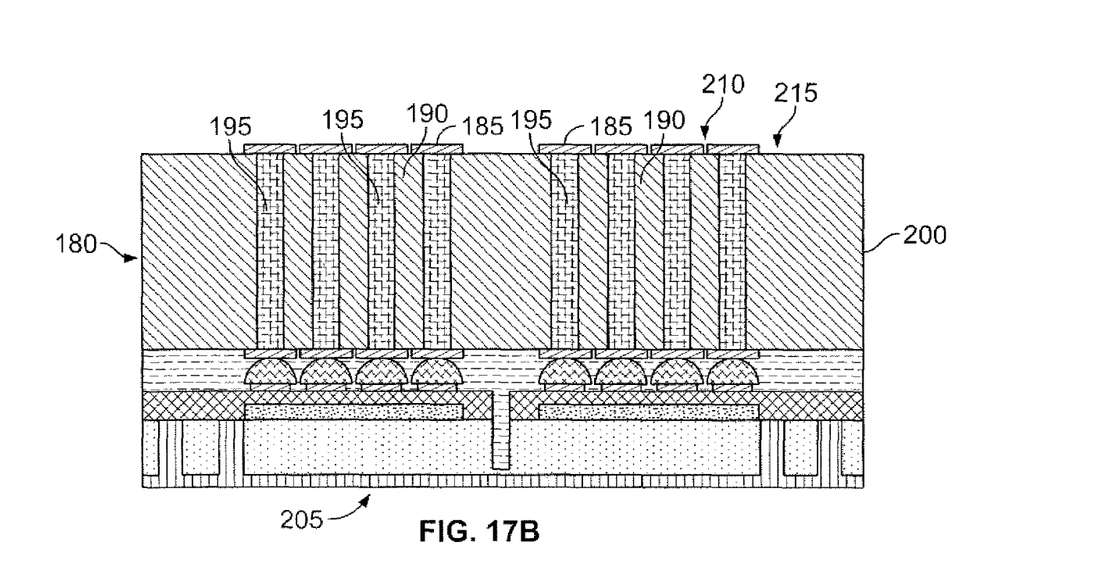
FIG. 17B is a side view of the back illuminated imager of FIG. 17A, showing the location of vias within the front side imaging area.

FIG. 17A shows a top plan view of a back illuminated imager 180 constructed in accordance with the bum-bonding technique of the present invention, while FIG. 17B is a side view. A plurality of bond pads 185 can be distributed over the imaging area 190 and aligned with the vias 195 of the support wafer 200. Since light enters only through the back side 205 of the imager 180, the bond pads 185 and vias 195 can be placed within the area 210 of the front side 215 of the imager 180 without affecting the collection of light upon the pixels (not shown). In this way, the overall size of the imager 180 can be reduced. The diced chips can be packaged using conventional ball grade array or bump bonding technique.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed:

1. A method for fabricating a semiconductor device, comprising the steps of:
   providing a substrate comprising:
      an insulator layer, and
      an epitaxial layer substantially overlying the insulator layer;
   forming a plurality of alignment keys substantially overlying the epitaxial layer by:
      printing key patterns on a top portion of the epitaxial layer,
      etching the underlying epitaxial layer below the key patterns using a trench etch process until the etched away silicon is stopped by the underlying insulator layer, and
      filling the opened trenches with an electrically insulating material;
   forming a plurality of bond pads substantially overlying the epitaxial layer;
   fabricating a dielectric layer substantially overlying the epitaxial layer;
   providing a handle wafer;
   forming a plurality of conductive trenches in the handle wafer;
   forming a plurality of conductive bumps on a first surface of the handle wafer substantially underlying the conductive trenches; and
   bonding the plurality of conductive bumps to the plurality of bond pads.

2. The method of claim 1, wherein the electrically insulating material is one of an oxide of silicon, silicon carbide, silicon nitride, and poly-silicon.

3. The method of claim 1, wherein the step of forming a plurality of conductive trenches in the handle wafer further comprises the steps of:
   etching vias in the handle wafer;
   filling the vias with a conducting material; and
   smoothing the first surface of the handle wafer.

4. The method of claim 3, wherein the vias are filled with a conductive material using one of an electroplating and sputtering technique.

5. The method of claim 1, further comprises the steps of:
   forming a plurality of bond pads substantially overlying a second surface of the handle wafer; and
   attaching a plurality of bond wires to the plurality of bond pads substantially overlying the second surface of the handle wafer.

6. The method of claim 5, wherein said step of forming a plurality of bond pads substantially overlying the second surface of the handle wafer further comprises the steps of:
   depositing a conductive material substantially on the second surface of the handle wafer; and
   patterning and etching the conductive material to obtain the plurality of bond pads over the filled metal trenches.

7. The method of claim 6, wherein the conductive material is made of a metal.

8. The method of claim 7, wherein the metal is one of gold, tin, and wolfram.

9. The method of claim 1, further comprising the step of fabricating at least one optical component substantially overlying the epitaxial layer and proximal to the insulating layer using the plurality of alignment keys as guides.

10. The method of claim 9, wherein the step of fabricating at least one optical component includes the step of fabricating color filters and micro-lenses, in any combination.

11. The method of claim 9, further comprising the step of forming a dielectric layer substantially overlying the epitaxial layer before said step of forming a plurality of bond pads substantially overlying the epitaxial layer.

12. The method of claim 11, further comprising the step of forming a plurality of conductive bond pads substantially on the first surface of the handle wafer substantially underlying the filled conductive trenches before said step of bonding the plurality of metal bumps to the plurality of bond pads substantially overlying the epitaxial layer.

13. The method of claim 1, wherein the handle wafer is fabricated from one of silicon, aluminum nitride, and ceramic.

14. The method of claim 1, wherein the step of bonding the plurality of metal bumps to the plurality of bond pads at least partially overlying the imaging area further comprises the steps of applying a predetermined pressure and temperature to the substrate and the handle wafer.

15. The method of claim 1, wherein resistivity of the epitaxial layer is controlled by the epitaxial profile.

16. The method of claim 1, further comprising the step of fabricating at least one imaging component at least partially overlying and extending into the epitaxial layer.

17. The method of claim 16, wherein the at least one imaging component has an imaging area, and wherein at least one of the plurality of bond pads substantially overlying the epitaxial layer also at least partially overlies the imaging area.

18. The method of claim 16, wherein the at least one imaging component includes at least one of CMOS imaging components, charge-coupled device (CCD) components, photodiodes, avalanche photodiodes, and phototransistors.

19. The method of claim 16, wherein the step of fabricating at least one imaging component at least partially overlying and extending into the epitaxial layer further comprises the steps of:

forming a second imaging component at least partially overlying and extending into the epitaxial layer, the at least one imaging component and the second imaging component being formed substantially between the alignment keys.

* * * * *